(12) United States Patent
Tilton et al.

(10) Patent No.: US 7,806,166 B1
(45) Date of Patent: Oct. 5, 2010

(54) INSULATED SPRAY COOLING SYSTEM FOR EXTREME ENVIRONMENTS

(75) Inventors: Charles L. Tilton, Colton, WA (US); William J. Beasley, Moscow, ID (US); Douglas W. Miller, Moscow, ID (US); Randall T. Palmer, Liberty Lake, WA (US)

(73) Assignee: Parker-Hannifin Corporation, Cleveland, OH (US)

( * ) Notice: Subject to any disclaimer, the term of this patent is extended or adjusted under 35 U.S.C. 154(b) by 682 days.

(21) Appl. No.: 11/303,864

(22) Filed: Dec. 15, 2005

Related U.S. Application Data

(63) Continuation-in-part of application No. 11/255,456, filed on Oct. 24, 2005, now Pat. No. 7,264,042, and a continuation-in-part of application No. 10/369,321, filed on Feb. 18, 2003, now Pat. No. 6,976,528, said application No. 11/255,456 is a continuation of application No. 10/369,321.

(51) Int. Cl.
*H05K 7/20* (2006.01)

(52) U.S. Cl. .......................... 165/58; 361/700; 165/80.5

(58) Field of Classification Search .................. 165/58, 165/80.2, 80.4, 80.5, 104.21, 104.22, 104.25, 165/104.33; 361/700; 174/547, 548, DIG. 34; 220/592.09, 592.2, 62.11, 62.18, 62.19, 62.22, 220/DIG. 9
See application file for complete search history.

(56) References Cited

U.S. PATENT DOCUMENTS

| | | | | | |
|---|---|---|---|---|---|
| 2,155,399 | A | * | 4/1939 | Bruce | 62/64 |
| 2,906,103 | A | * | 9/1959 | Saltzman | 62/231 |
| 2,966,040 | A | * | 12/1960 | Henry | 62/47.1 |
| 4,010,939 | A | * | 3/1977 | Allyn et al. | 266/242 |
| 4,694,119 | A | * | 9/1987 | Groenewegen | 174/521 |
| 4,715,189 | A | * | 12/1987 | Hohenwarter | 62/64 |
| 4,734,820 | A | * | 3/1988 | Lauffer et al. | 361/700 |
| 4,897,762 | A | * | 1/1990 | Daikoku et al. | 361/689 |
| 5,506,200 | A | * | 4/1996 | Hirschkoff et al. | 505/162 |
| 5,768,103 | A | * | 6/1998 | Kobrinetz et al. | 361/699 |
| 5,846,852 | A | * | 12/1998 | Limper-Brenner et al. | 438/118 |
| 5,966,951 | A | * | 10/1999 | Hallin et al. | 62/141 |
| 6,519,955 | B2 | | 2/2003 | Marsala | 62/119 |
| 6,679,081 | B2 | | 1/2004 | Marsala | 62/259.2 |
| 6,744,136 | B2 | * | 6/2004 | Dubhashi | 257/714 |
| 2002/0113142 | A1 | * | 8/2002 | Patel et al. | 239/128 |

* cited by examiner

*Primary Examiner*—Teresa J Walberg
(74) *Attorney, Agent, or Firm*—Michael S. Neustel

(57) ABSTRACT

An insulated spray cooling system for extreme environments for providing a desired enclosed environment for electronic devices regardless of external environmental conditions. The insulated spray cooling system for extreme environments includes an insulated enclosure that isolates the electronic devices being thermally managed from the external environment and a thermal management unit within the enclosure for thermally managing electronic devices.

29 Claims, 13 Drawing Sheets

INSULATED SPRAY COOLING SYSTEM FOR EXTREME ENVIRONMENTS

CROSS REFERENCE TO RELATED APPLICATIONS

I hereby claim benefit under Title 35, United States Code, Section 120 of U.S. patent application Ser. No. 10/369,321 filed Feb. 18, 2003 and Ser. No. 11/255,456 filed Oct. 24, 2005. This application is a continuation-in-part of the application Ser. No. 10/369,321 and the application Ser. No. 11/255,456. The application Ser. No. 10/369,321 is now U.S. Pat. No. 6,976,528 with the issue fee paid on Oct. 27, 2005. The application Ser. No. 11/255,456 is a continuation from the Ser. No. 10/369,321 and is now U.S. Pat. No. 7,264,042. The application Ser. No. 10/369,321 and the application Ser. No. 11/255,456 are hereby incorporated by reference into this application.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. F33657-97-C-4505 awarded by the U.S. Air Force.

BACKGROUND OF THE INVENTION

1. Field of the Invention

The present invention relates generally to thermal management devices for electronic devices and more specifically it relates to an insulated spray cooling system for extreme environments for providing an isolated environment for electronic devices regardless of external environmental conditions.

2. Description of the Related Art

Any discussion of the prior art throughout the specification should in no way be considered as an admission that such prior art is widely known or forms part of common general knowledge in the field.

Thermal management systems for electronic systems have been in use for years. In order to maintain maximum performance from electronic components, the components need to be maintained within a relatively narrow temperature band. Thermal management systems are utilized to maintain this desired narrow temperature band.

In environments where extreme temperatures are present (e.g. −65° C., +70° C., etc.), it is critical to provide a thermal management system that provides a desired internal operating environment to maintain peak efficiency, power and prevent system failure. In addition, some external environments include hostile elements such as but not limited to dust, sand, debris, salt water, salt fog, condensed water vapor, contaminants and the like, which require the complete isolation of electronic components from the harsh external environment. Extreme external environments are encountered within various applications such as aircraft, ships, ground based applications and the like. It is absolutely crucial that electronic components be maintained in a safe internally controlled environment when in extreme external environments.

Conventional thermal management systems commonly utilized today are comprised of air-cooled enclosures (forced flow or free flow), conduction cooling and liquid immersion cooling. Spray cooling technologies are being adopted today as the most efficient option for thermally managing electronic systems in an enclosed internal environment. Spray cooling utilizes an atomized dielectric spray that is applied directly to the electronic device thereby forming a thin film on the electronic device. Spray cooling may be performed locally (i.e. where the chip is sprayed directly) or globally (i.e. where the chip and surrounding electronics/boards are also sprayed). U.S. Pat. No. 5,220,804 entitled High Heat Flux Evaporative Spray Cooling to Tilton et al. describes the earlier versions of spray cooling technology. U.S. Pat. No. 6,108,201 entitled Fluid Control Apparatus and Method for Spray Cooling to Tilton et al. also describes the usage of spray cooling technology to cool a printed circuit board.

BRIEF SUMMARY OF THE INVENTION

In view of the foregoing disadvantages inherent in the known types of thermal management systems now present in the prior art, the present invention provides a new insulated spray cooling system for extreme environments wherein the same can be utilized for providing a desired enclosed environment for electronic devices regardless of external environmental conditions.

The general purpose of the present invention, which will be described subsequently in greater detail, is to provide a new insulated spray cooling system for extreme environments that has many of the advantages of the thermal management systems mentioned heretofore and many novel features that result in a new insulated spray cooling system for extreme environments which is not anticipated, rendered obvious, suggested, or even implied by any of the prior art thermal management systems, either alone or in any combination thereof.

To attain this, the present invention generally comprises an insulated enclosure that isolates the electronic components from the external environment, a spray unit within the enclosure for thermally managing one or more electronic devices, a pump unit fluidly connected to the spray unit, a heat exchanger unit fluidly connected to the pump, and a control valve fluidly connected between the heat exchanger unit and the pump. An independent chamber preferably houses a heater unit, a first power supply and a control unit, whereby the heater unit initially heats the coolant within the independent chamber to a minimum operating temperature prior to operation of the electronic components.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide an insulated spray cooling system for extreme environments that will overcome the shortcomings of the prior art devices.

A second object is to provide an insulated spray cooling system for extreme environments for providing a desired enclosed environment for electronic devices regardless of external environmental conditions.

A further object is to provide an insulated spray cooling system for extreme environments that may be utilized in various extreme environmental conditions including extreme external temperature conditions (e.g. −65° C., +70° C.).

Another object is to provide an insulated spray cooling system for extreme environments that provides increased electronics performance regardless of external environmental conditions.

A further object is to provide an insulated spray cooling system for extreme environments that isolates electronic devices from the external environment and external harmful elements.

A further object is to provide an insulated spray cooling system for extreme environments that has an insulated enclosure that significantly limits heat transfer from the coolant within the enclosure to the external environment.

A further object is to provide an insulated spray cooling system for extreme environments that maintains a constant internal operating temperature for electronic devices wherein no control is exercised over the cooling airflow through the heat exchanger (i.e. velocity, density, temperature).

Another object is to provide an insulated spray cooling system for extreme environments that is suitable for use in airborne, ship and ground based environments.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
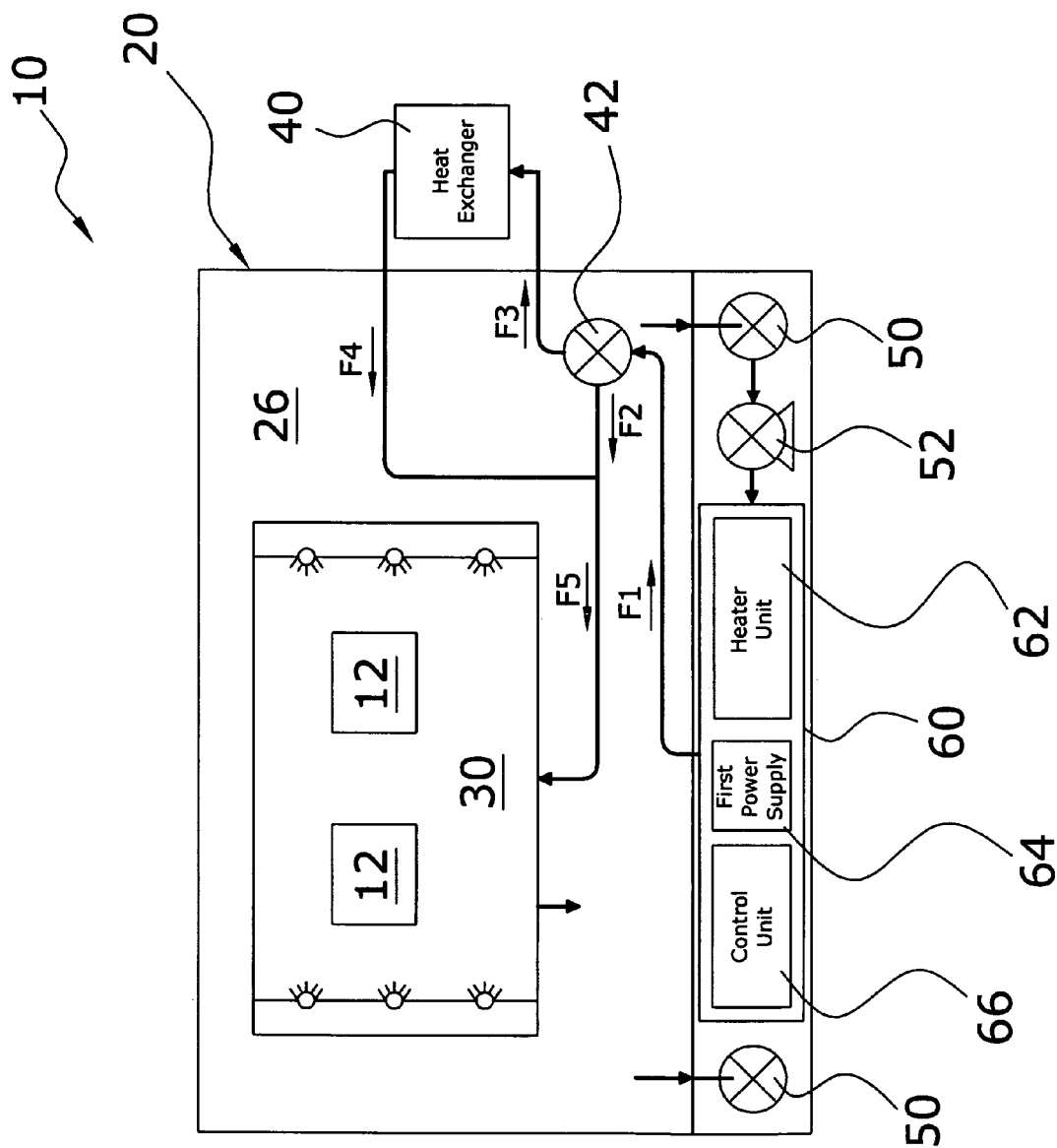
FIG. 1 is a schematic illustration of the present invention.

Turning now descriptively to the drawings, in which similar reference characters denote similar elements throughout the several views, FIGS. 1 through 15 illustrate an insulated spray cooling system for extreme environments 10, which comprises an enclosure 20 that isolates the electronic components from the external environment, a spray unit 30 within the enclosure 20 for thermally managing one or more electronic devices 12, a pump unit 52 fluidly connected to the spray unit 30, a heat exchanger unit 40 fluidly connected to the pump, and a control valve 42 fluidly connected between the heat exchanger unit 40 and the pump. An independent chamber 60 preferably houses a heater unit 62, a first power supply 64 and a control unit 66, whereby the heater unit 62 initially heats the coolant within the independent chamber 60 to a minimum operating temperature prior to operation of the electronic components. The present invention may be utilized in various extreme environmental conditions including extreme external temperature conditions (e.g. −65° C., +70° C.).

B. Enclosure

The enclosure 20 is comprised of a structure having at least one isolated internal compartment. The internal compartment is preferably insulated from the external environment to reduce the heat transfer from within the internal compartment to the external environment. The enclosure 20 may be comprised of various structures and configurations capable of isolating the internal compartment from the extreme elements and temperatures of the external environment.

The purpose of insulating the enclosure 20 is to retain heat within the interior cavity 26 of the enclosure 20 to protect the electrical components from the extreme temperatures of the external environment. The enclosure 20 may be insulated in various manners as shown in FIGS. 7 through 15 of the drawings, with each having its own advantages.

Figure 7:
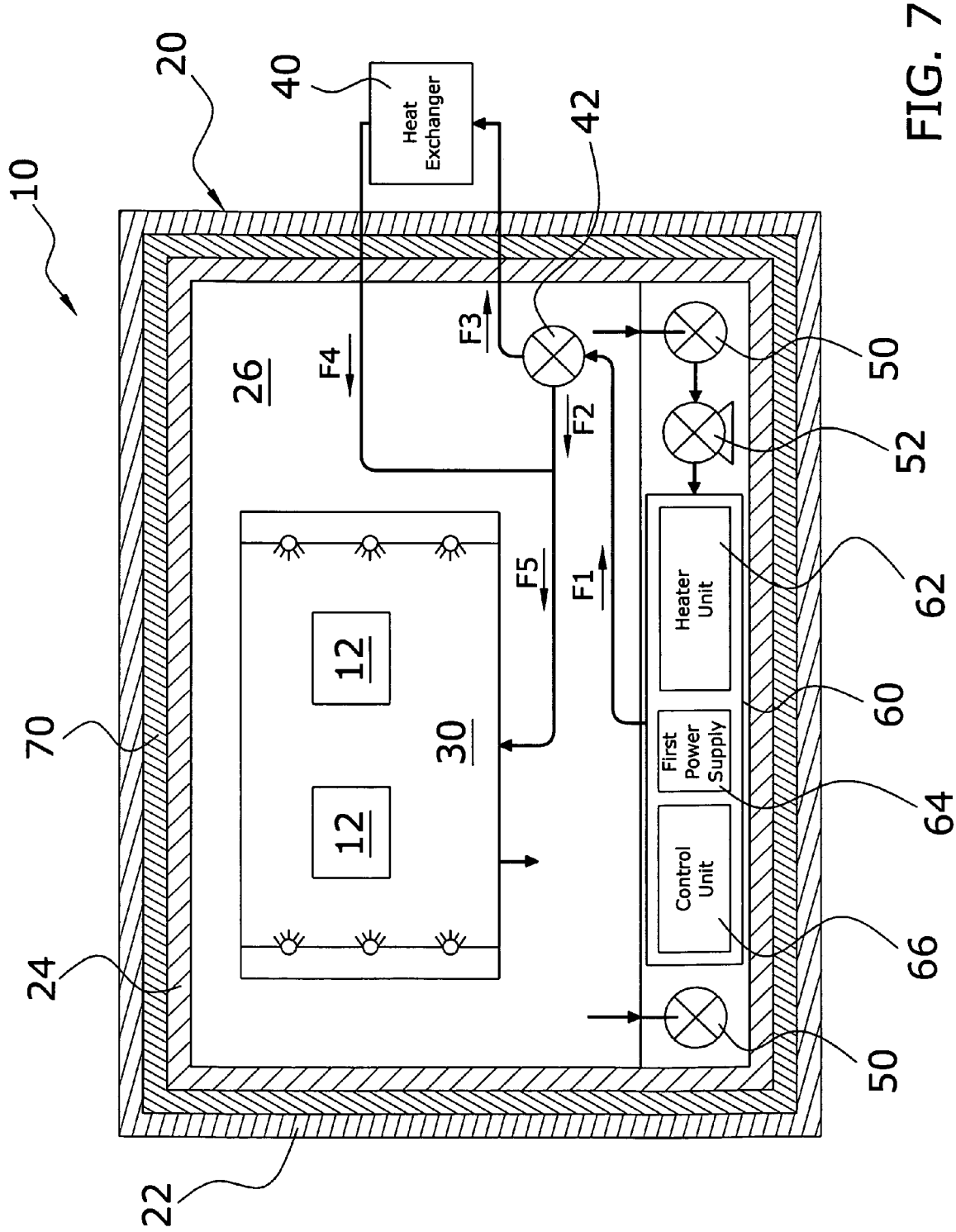
FIG. 7 is a cutaway view illustrating insulation between an inner wall and an outer wall of the enclosure.

As shown in FIG. 7 of the drawings, the enclosure 20 may be comprised of an outer wall 22, an inner wall 24 defining the interior cavity 26 and at least one layer of insulation 70 between the outer wall 22 and the inner wall 24. The insulation 70 within the enclosure 20 may extend about the entire enclosure 20 or only portions thereof.

Figure 8:
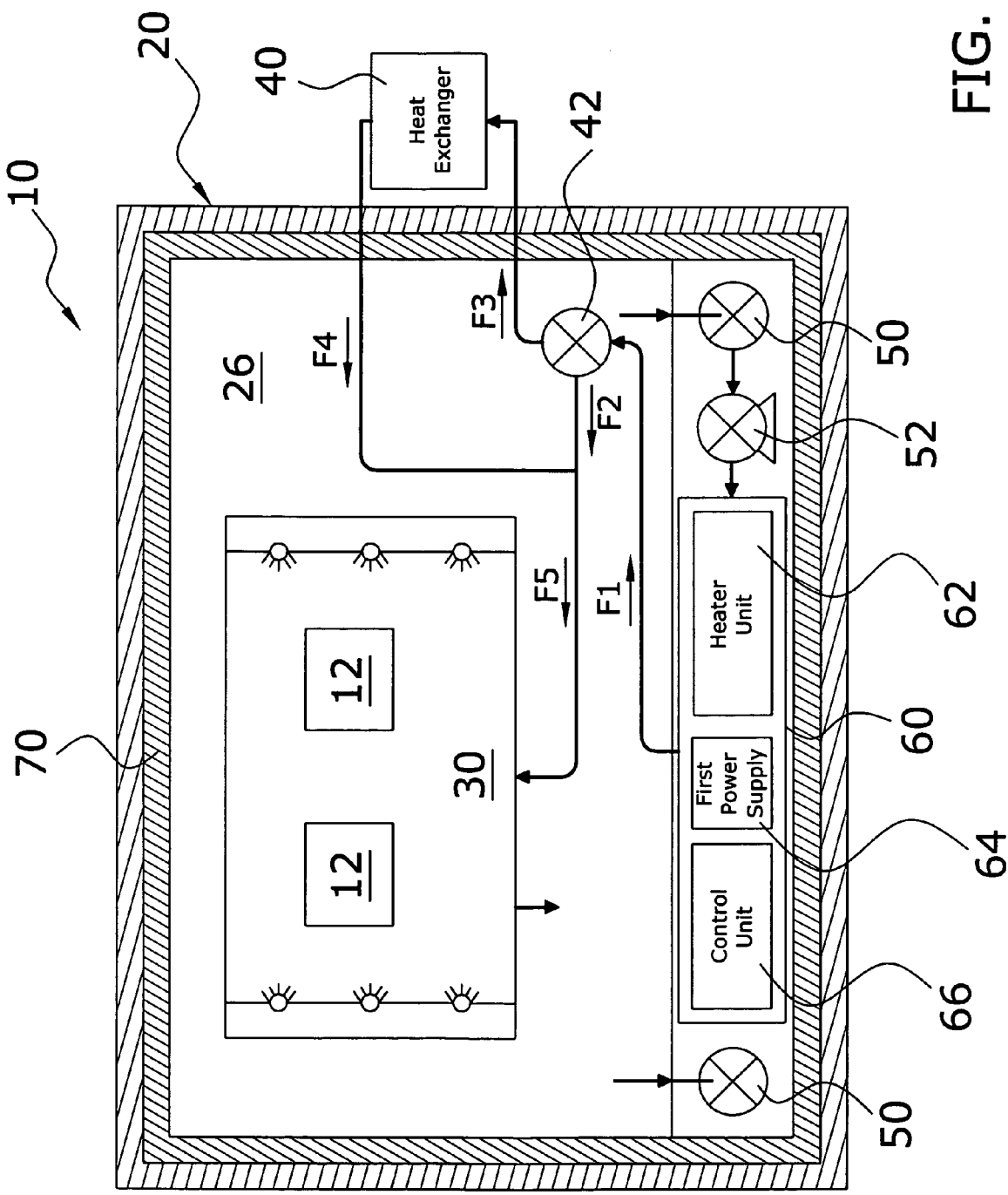
FIG. 8 is a cutaway view illustrating insulation attached to an inner portion of the enclosure.
Figure 9:
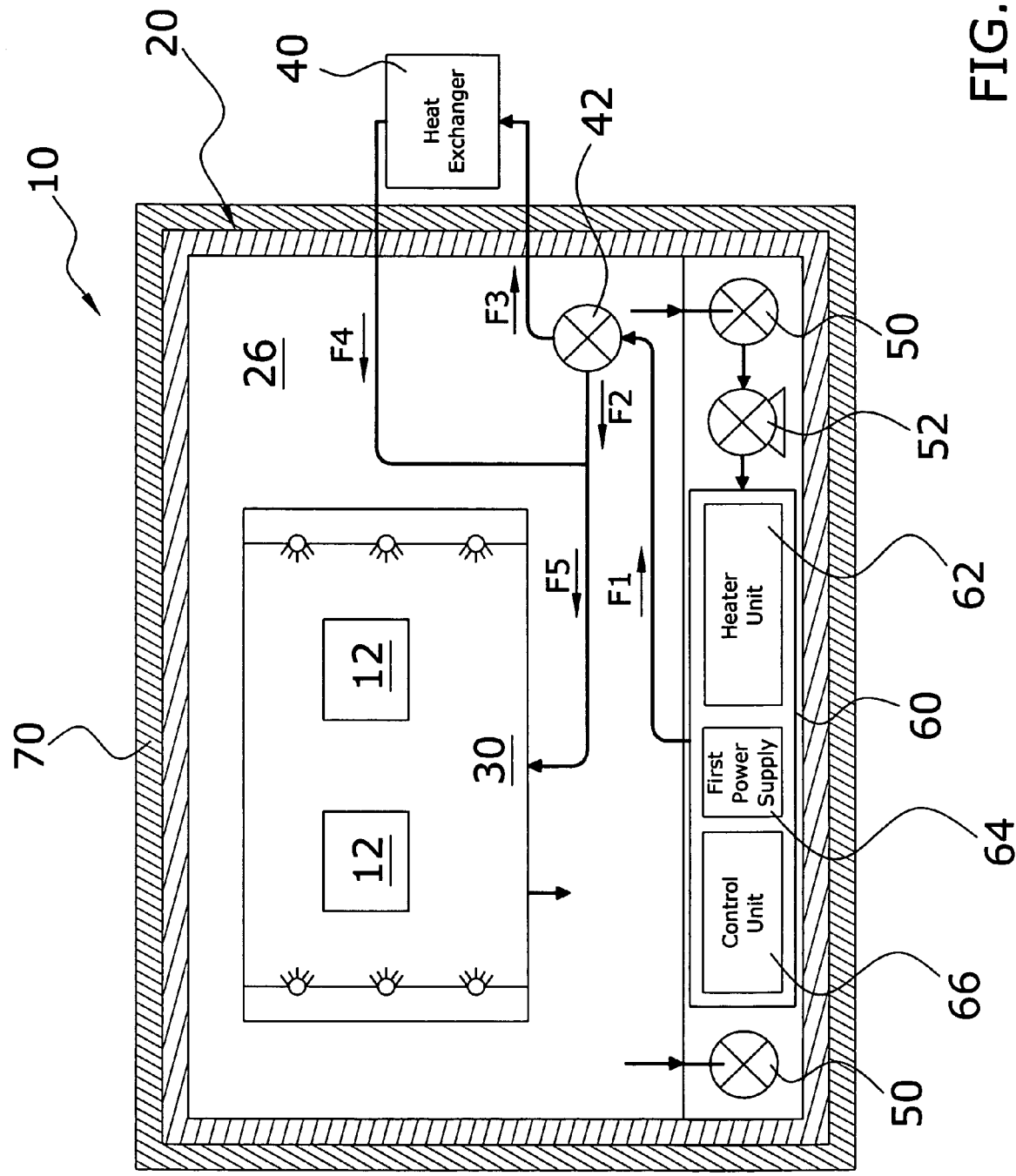
FIG. 9 is a cutaway view illustrating insulation attached to an outer portion of the enclosure.
Figure 10:
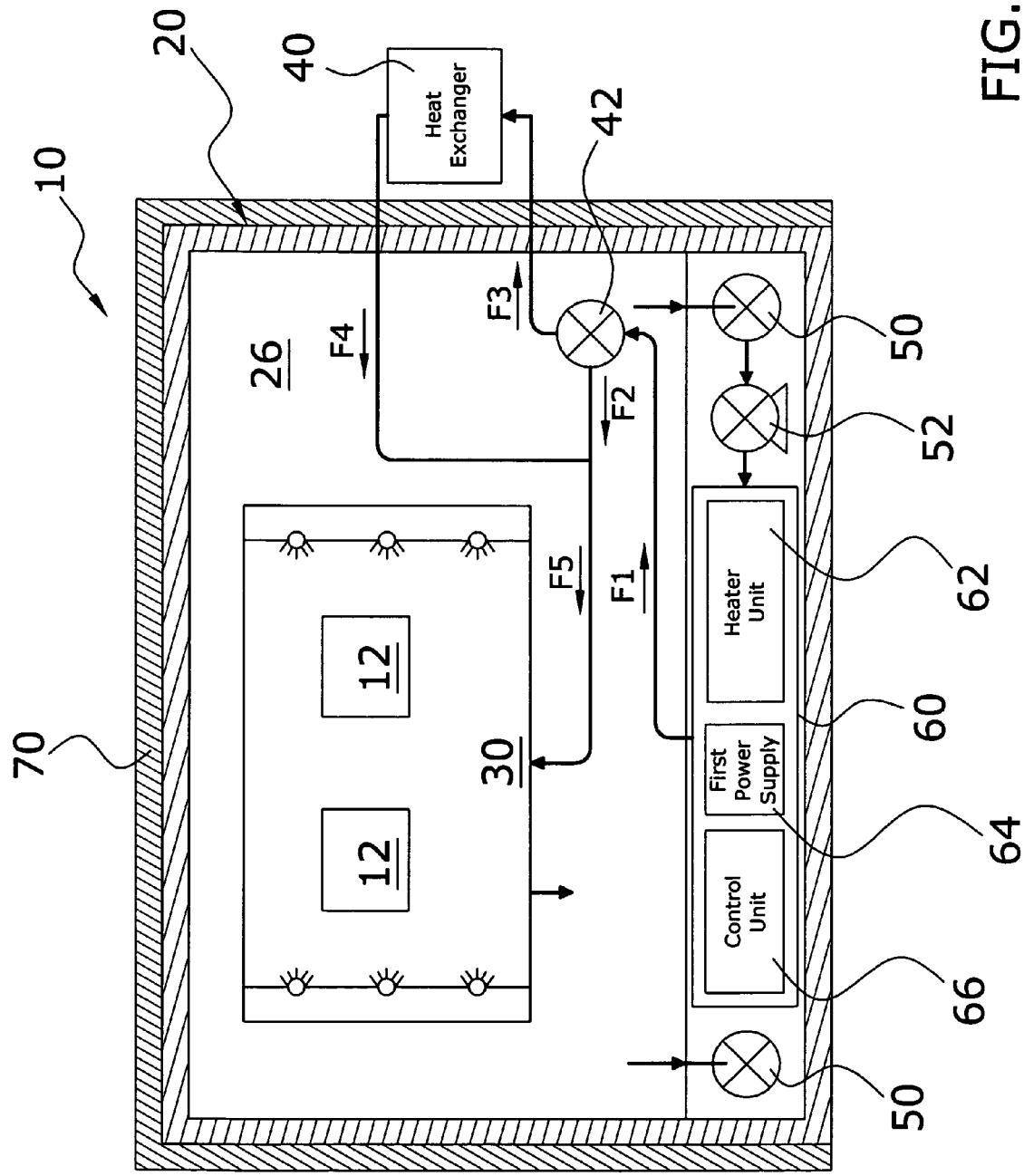
FIG. 10 is a cutaway view illustrating insulation partially surrounding the enclosure.
Figure 11:
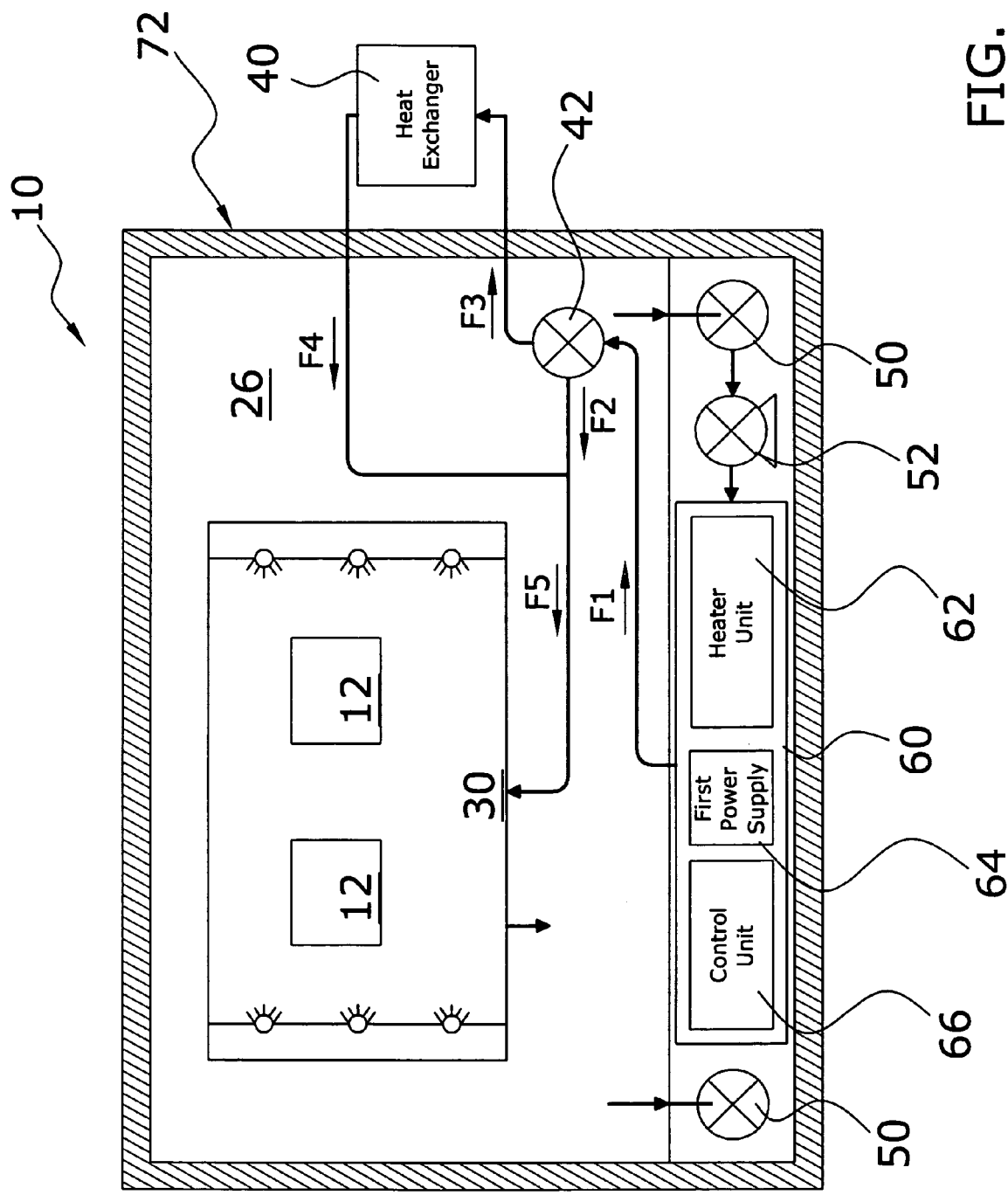
FIG. 11 is a cutaway view illustrating an insulating enclosure.

FIG. 8 illustrates the layer of insulation 70 attached to an interior portion of the enclosure 20. FIG. 9 illustrates the layer of insulation 70 completely surrounding an exterior portion of the enclosure 20. FIG. 10 illustrates the layer of insulation 70 surrounding only a portion of the exterior portion of the enclosure 20. FIG. 11 illustrates an insulating enclosure 72 that defines the interior cavity 26 and that is comprised of an insulating material.

The insulation 70 and the insulating enclosure 72 may be comprised of a homogeneous material (e.g. plastic, acrylic, epoxy) or non-homogeneous material or composite (e.g. plastic with fiberglass, carbon fiber and graphite fiber). The insulation 70 and the insulating enclosure 72 are preferably comprised of a material (e.g. plastic) that includes fiberglass fibers for reinforcement. Fiberglass is comprised of fine glass fibers and is a good insulating material while simultaneously increasing the strength and decreasing the weight of the enclosure 20. The insulation 70 utilized between the inner wall 24 and the outer wall 22 of the enclosure 20 as shown in FIG. 7 may be comprised of various insulating materials such as but not limited to fiber reinforced ceramic, insulating gas, or a vacuum (with or without a honeycomb or other equivalent reinforcing wall structure). The insulation 70 is comprised of a material, preferably a non-metal such as plastic, having a thermal conductivity less than (or a thermal resistance greater than) aluminum. In other words, the insulation 70 is comprised of a material having a thermal conductivity less than 237 W/mK at 300K).

In addition to a non-movable insulation 70 for the enclosure, FIGS. 12 through 15 illustrate the usage of a movable insulation 70 to adjust the thermal resistance for the enclosure 20. The insulation 70 may be adjustable throughout the entire enclosure 20 or in only a portion of the enclosure 20. Portions of the insulation 70 may be adjustable with other portions non-adjustable. The amount of adjustment of the thermal resistance can be varied depending upon the external environment and internal conditions of the enclosure 20. For example, in extremely cold environments (e.g. −65° C.) it is desirable to increase the insulating characteristics of the insulation 70 to reduce heat lost from the enclosure to the environment. In addition, in extremely hot environments (e.g. +70° C.) it is desirable to decrease the insulating characteristics of the insulation 70 to increase heat lost from the enclosure to the environment to assist in increasing the thermal management efficiency of the system.

Figure 12:
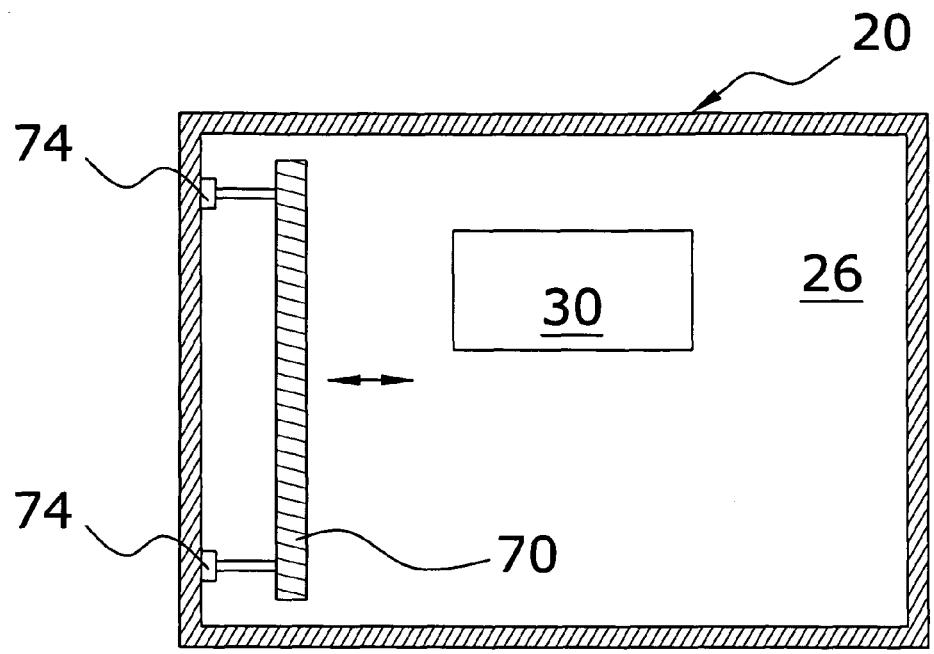
FIG. 12 is a cutaway view illustrating insulation that is moved away from an interior wall of the enclosure by one or more actuators to modify the insulating characteristics.

FIG. 12 illustrates the usage of actuators 74 or related devices to manipulate the position of the insulation 70 with respect to the enclosure. The actuators 74 may be connected in any manner to selectively position or slide a side (or a portion of a side) of the insulation 70 against the interior wall of the enclosure 20 (or alternatively external wall of the enclosure) to increase the insulating characteristics of the enclosure 20. When the insulation 70 is adjacent the interior surface of the enclosure the coolant (liquid and vapor phases) is unable to efficiently thermally communicate with the enclosure itself thereby increasing the thermal resistance between the external environment and the interior cavity 26 of the enclosure 20. When the actuators 74 or other devices extend the insulation 70 away from the surface of the enclosure the coolant is then able to directly contact the enclosure 20 and in effect reduces the thermal resistance between the external environment and the interior cavity 26.

Figure 13:
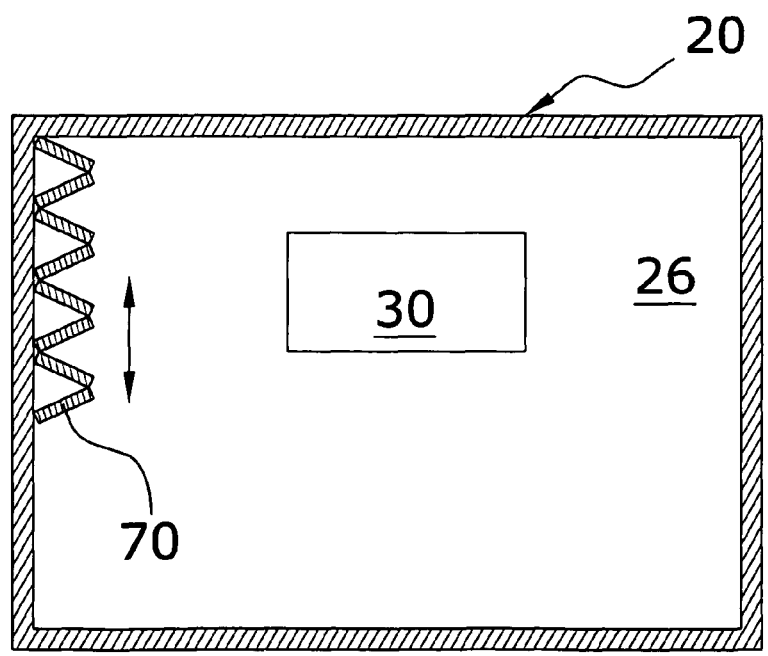
FIG. 13 is a cutaway view illustrating insulation that is foldable to modify the insulating characteristics.

FIG. 13 illustrates the usage of a folding insulation 70 that is comprised of a plurality of segments pivotally attached to one another. The folding insulation 70 may be drawn into a contracted position and extended into an extended position utilizing conventional devices such as a cable attached to a motor or actuator. When increased thermal resistance is desired, the folding insulation 70 is extended so as to be substantially adjacent and flat against the surface of the enclosure. When decreased thermal resistance is desired, the folding insulation 70 is retracted so as to be substantially away from the surface of the enclosure.

Figure 14:
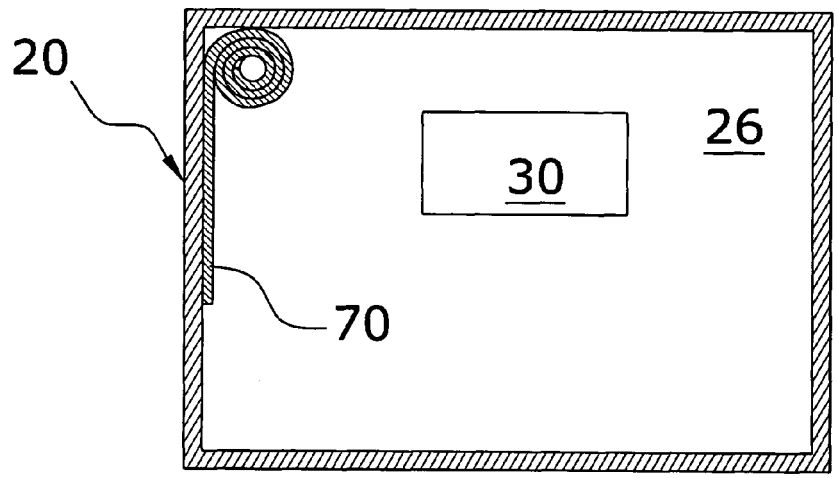
FIG. 14 is a cutaway view illustrating insulation that is retractable into and extendable from a roll unit to modify the insulating characteristics.

FIG. 14 illustrates the usage of a sheet of insulation 70 that is dispensed from and is retractable into a storage unit having a roller. The sheet of insulation 70 may be drawn into a contracted position and extended into an extended position utilizing conventional motors attached to the storage unit. When increased thermal resistance is desired, the insulation 70 is extended so as to be substantially adjacent and flat against the surface of the enclosure. When decreased thermal resistance is desired, the insulation 70 is retracted so as to be substantially away from the surface of the enclosure.

Figure 15:
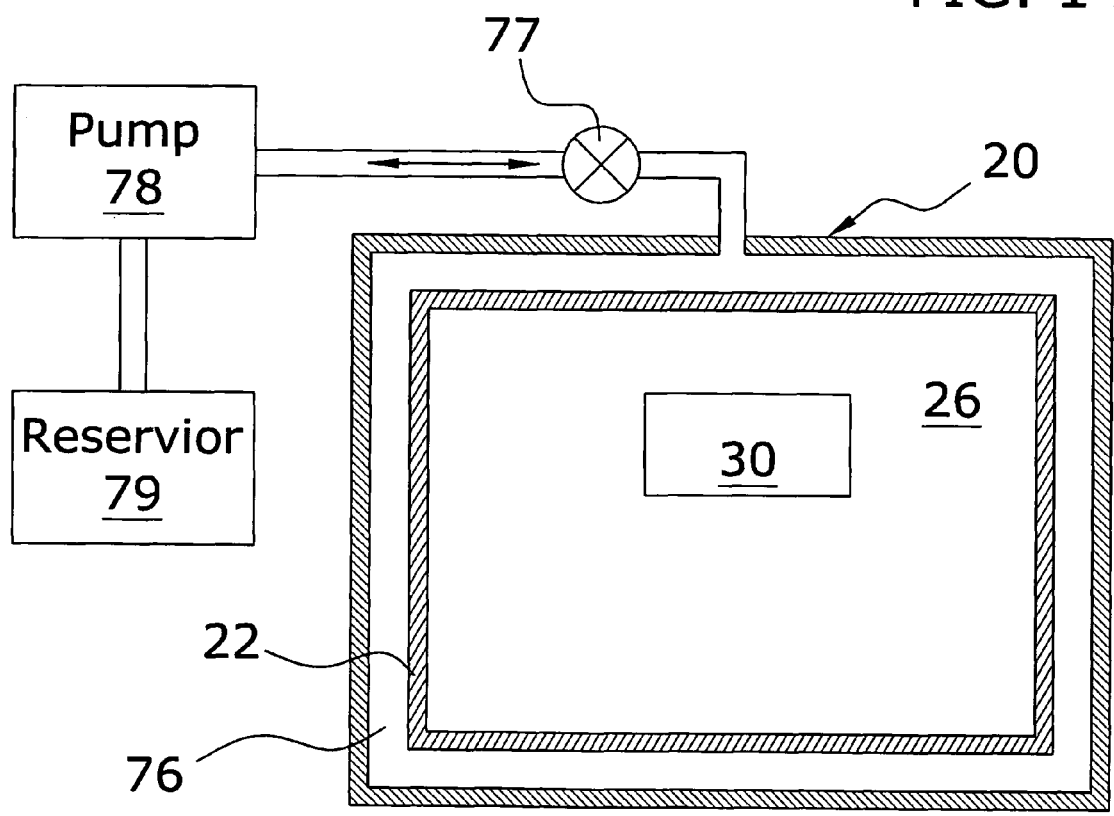
FIG. 15 is a cutaway view illustrating the usage of one or more pumps to selectively create a vacuum within or input a gas/liquid into a cavity within the enclosure to modify the insulating characteristics.

FIG. 15 illustrates the usage of one or more pumps 78 to input gases and/or liquids into a cavity 76 between an outer wall 22 and an inner wall 24 of the enclosure to adjust the thermal resistance of the enclosure 20. A reservoir 79 may be fluidly connected to the pump 78 to receive, store and dispense the gas and/or liquids. Alternatively, the gas and/or liquids may be transferred from one cavity 76 to another within the enclosure 20. A valve 77 may be included between the pump 78 and the cavity 76 to control the gas and/or liquid flow. The cavity may extend around the entire portion of the enclosure 20 or only a portion of the enclosure 20. When increased thermal resistance is desired, a vacuum is created within the cavity 76 or a gas/liquid having an increased thermal resistance is input into the cavity 76 by the pump 78. When decreased thermal resistance is desired, a vacuum is removed within the cavity 76 by allowing air or another thermally conductive gas/liquid (including the primary coolant) into the cavity 76. Alternatively, a thermally resistive gas/liquid previously input into the cavity 76 may be removed by the pump and a replacement gas/liquid is input within the cavity 76 thereby decreasing the overall thermal resistance of the enclosure 20.

In another embodiment, the inner wall 24 surrounding the interior cavity 26 is constructed of a flexible and resilient material that allows for the expansion and contraction thereof. When pressure within the interior cavity 26 accumulates (e.g. during system heat up) the flexible inner wall 24 is forced outwardly toward the outer wall 22 thereby expelling a portion of or all of the gas and/or liquid within the cavity 76, thereby decreasing the thermal resistance in the enclosure 20 (particularly as the inner wall 24 comes in increased contact with the outer wall 22). Conversely, when the interior cavity 26 of the enclosure 20 cools the internal pressure is reduced thereby allowing the inner wall 24 to return to its original state away from the outer wall 22 which allows the gas and/or liquid to reenter the cavity 76 resulting in an increased thermal resistance of the enclosure 20.

C. Spray Unit

The spray unit 30 is positioned within the internal compartment of the enclosure 20. The spray unit 30 preferably has a separate enclosed structure for retaining and thermally managing the electronic devices 12. The spray unit 30 may have an integral card cage spray assembly or similar structure for retaining the electronic devices 12. More than one spray unit 30 may be utilized within the present invention.

The spray unit 30 may include one or more spray nozzles for applying atomized liquid coolant upon the electronic devices 12. The spray unit 30 may be comprised of various well-known spray cooling systems currently available for thermally managing electronic devices 12 with an atomized coolant.

D. Heat Exchanger Unit

The heat exchanger unit 40 is fluidly connected to the spray unit 30 via coolant path F4 as shown in FIG. 1 of the drawings. The heat exchanger unit 40 is preferably positioned externally of the enclosure 20 in direct contact with the external environment where the air temperature, density and flow rate may vary greatly. The heat exchanger unit 40 may be comprised of various well-known structures commonly utilized within heat exchangers. More than one heat exchanger unit 40 may be utilized within the present invention.

E. Electronic Control System

Figure 2:
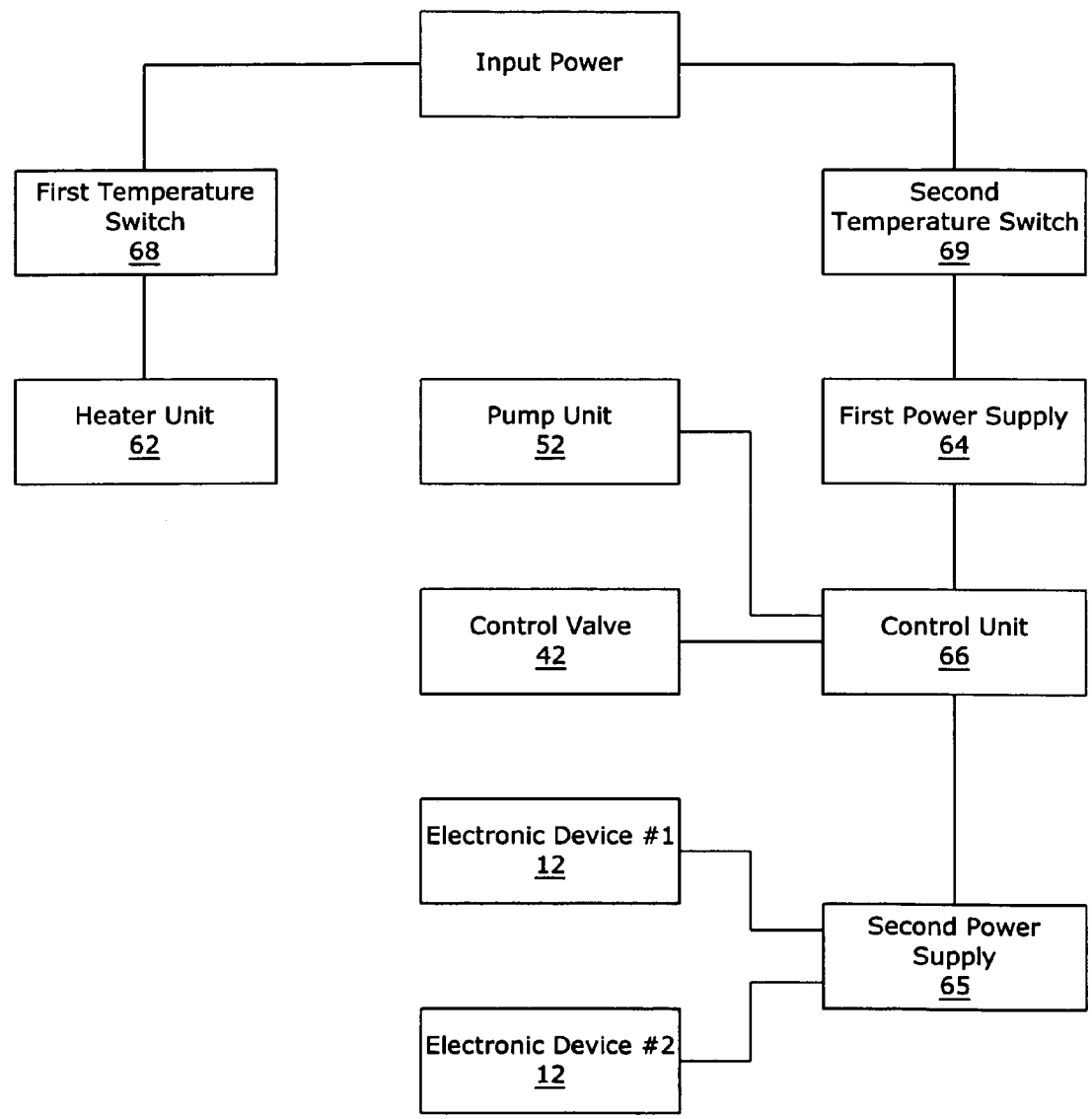
FIG. 2 is a block diagram of the electrical connections of the present invention.

FIG. 2 illustrates the electronic control system utilized within the present invention. More particularly, FIG. 2 illustrates a first temperature switch 68 and a second temperature switch 69 electrically connected to an input power. The input power may be comprised of a battery supply, generator or the vehicle's power supply. The input power may be comprised of alternating current (AC) or direct current (DC) operating at various voltage levels. A power filter may be electrically connected between the input power and the power supplies.

The temperature switch is electrically connected to and controls a heater unit 62 as further shown in FIG. 2 of the drawings. The first temperature switch 68 is normally within a closed state when the coolant temperature is below a minimum operating temperature 1 (hereinafter "MOT 1") thereby activating the heat unit to heat the coolant. The MOT 1 is a minimum operating temperature required to operate the first power supply 64, control unit 66, pump unit 52 and control valve 42. The MOT 1 may have various temperature set points and temperature ranges such as but not limited to −40° to −35° Celsius. The first temperature switch 68 preferably remains closed until the coolant temperature exceeds a minimum operating temperature 3 (hereinafter "MOT 3"). The MOT 3 may have various temperature set points and temperature ranges such as but not limited to −20° to −10° Celsius.

As shown in FIG. 2 of the drawings, the second temperature switch 69 is electrically connected to the first power supply 64 for providing electrical power to the first power supply 64 after the coolant temperature exceeds the MOT 1. The control unit 66 is in communication with the pump unit 52 and the control valve 42 for controlling the same.

The control unit 66 is further in communication with the second power supply 65, wherein the second power supply 65 is electrically connected to the electronic devices 12 within the spray unit 30 to be thermally managed as shown in FIG. 2 of the drawings. The second power supply 65 provides electrical power to the electronic devices 12 during normal operating conditions. The second power supply 65 may be located within the independent chamber 60 or within the spray unit 30. The control unit 66 activates the second power supply 65 and after the coolant temperature exceeds the minimum operating temperature 2 (hereinafter "MOT 2"). The MOT 2 is a temperature that is sufficient for the electronic devices 12 to operate. The MOT 2 may have various temperature set points and temperature ranges such as but not limited to −20° to −10° Celsius.

The control unit 66 may be comprised of various electronic devices 12 capable of communicating with and controlling the electronic devices 12, the spray unit 30, the heat exchanger unit 40, the pump unit 52, valves, the control valve 42 and other devices. The control unit 66 may be comprised of a computer or other electronic device capable of receiving and storing commands.

The control unit 66 may communicate with the external electrical devices such as but not limited to electrically or via communications signal. It can be appreciated that more than one control unit 66 may be utilized to control one or more of the components of the present invention.

F. Independent Chamber

As shown in FIG. 1 of the drawings, an independent chamber 60 is preferably positioned within the enclosure 20 for housing the heater unit 62, the first power supply 64 and the control unit 66. The independent chamber 60 is preferably fluidly connected to the pressurized side of the pump unit 52 for receiving the coolant during operation of the pump unit 52.

During the initial operation of the present invention, the heater unit 62 is first activated (without the pump unit 52 operating) to first heat the coolant within the independent chamber 60 thereby increasing the temperature of the first power supply 64 and the control unit 66 to a minimum operating temperature. The first power supply 64 is preferably positioned near the heater unit 62 thereby allowing the first power supply 64 to be heated initially as illustrated in FIG. 1 of the drawings.

G. Coolant Distribution System

The coolant distribution system of the present invention has two basic flow patterns. Each flow pattern begins with the one or more attitude independent valves 50 that are fluidly connected to the spray unit 30 for collecting the coolant. The attitude independent valves 50 may be positioned in various locations within the spray unit 30 for collecting a sufficient volume of liquid coolant during operation. Various other coolant collection devices may be utilized to collect the coolant from within the spray unit 30. The coolant distribution system of the present invention preferably does not utilize a reservoir, however it can be appreciated that a coolant reservoir may be utilized.

The attitude independent valves 50 are fluidly connected to the pump unit 52 as illustrated in FIG. 1 of the drawings. The pump unit 52 draws the liquid coolant and then dispenses the pressurized liquid coolant into the independent chamber 60. It can be appreciated that a portion of the pressurized coolant may be diverted around the independent chamber 60 instead of passing through the independent chamber 60.

The pump unit 52 forces the liquid coolant into the independent chamber 60 and then through flow path F1 as shown in FIG. 1 of the drawings. The pump unit 52 may be comprised of a conventional coolant pump and may be comprised of more than one pump. The independent chamber 60 is fluidly connected to the control valve 42 as further shown in FIG. 1 of the drawings. The control valve 42 controls the flow of the coolant through Path 1 (F1, F2, F5) or Path 2 (F1, F3, F4, F5) to the spray unit 30.

Path 1 (F1, F2, F5) provides a direct path for the coolant from the independent chamber 60 to the spray unit 30 without cooling through the heat exchanger unit 40 as shown in FIG. 1 of the drawings. Path 2 (F1, F3, F4, F5) diverts a portion of the coolant through the heat exchanger unit 40 to be cooled prior to the coolant entering the spray unit 30 as further shown in FIG. 1 of the drawings.

Figure 4:
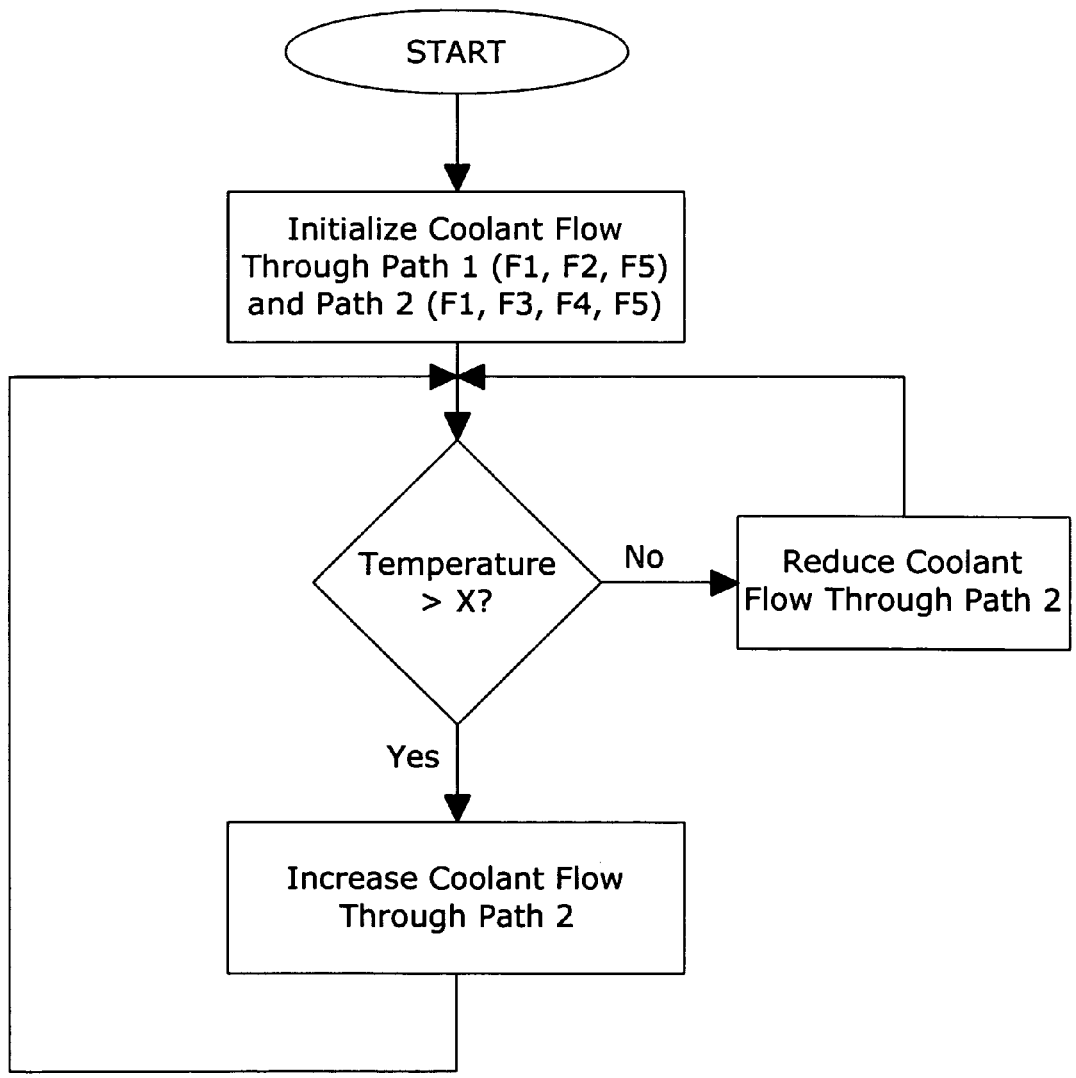
FIG. 4 is a flowchart illustrating the control of fluid flow through the present invention.

The control valve 42 controls the flow through Path 1 and Path 2 depending upon the temperature of the coolant. If the temperature of the coolant is less than temperature X, then the coolant flow is reduced through Path 2 and increased through Path 1 as shown in FIG. 4 of the drawings. The temperature X may have various temperature set points and temperature ranges such as but not limited to +40° to +50° Celsius. If the temperature of the coolant is greater than temperature X, then the coolant flow is increased through Path 2 and decreased through Path 1 as shown in FIG. 4 of the drawings.

H. Operation

Figure 3:
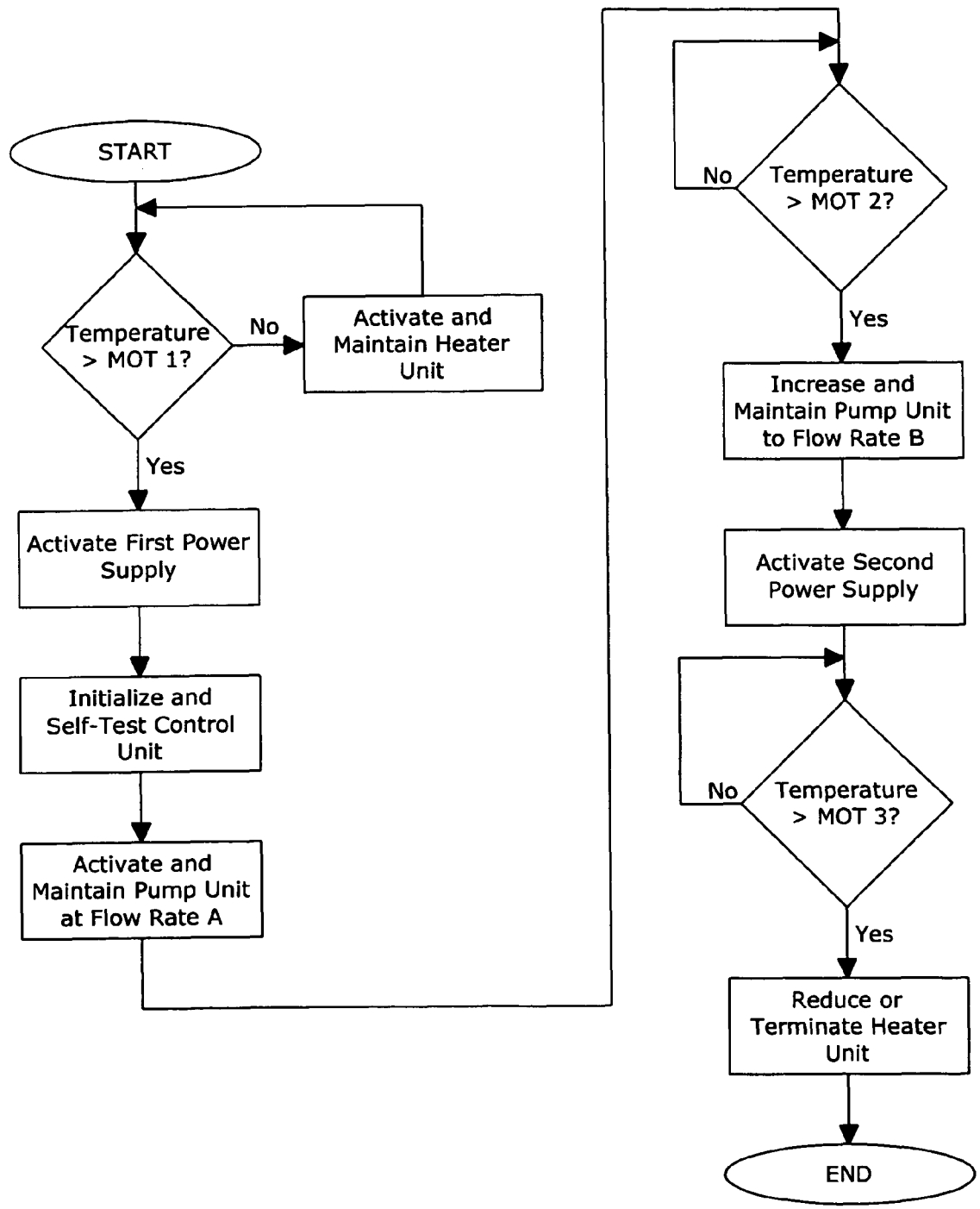
FIG. 3 is a flowchart illustrating the activation and operation of the present invention.

FIGS. 3 and 4 provide the overall operation of the present invention. If the initial coolant temperature is less than or equal to the MOT 1, then the first temperature switch 68 first activates the heater unit 62 prior to activating the pump unit 52 or other electrical components. The heater unit 62 heats the coolant within the independent chamber 60 as illustrated in FIG. 1 of the drawings. Since the first power supply 64 is preferably closest to the heater unit 62, the first power supply 64 is initially increased in temperature. The control unit 66 is also increased in temperature since the control unit 66 is also positioned within the independent chamber 60.

Figure 5:
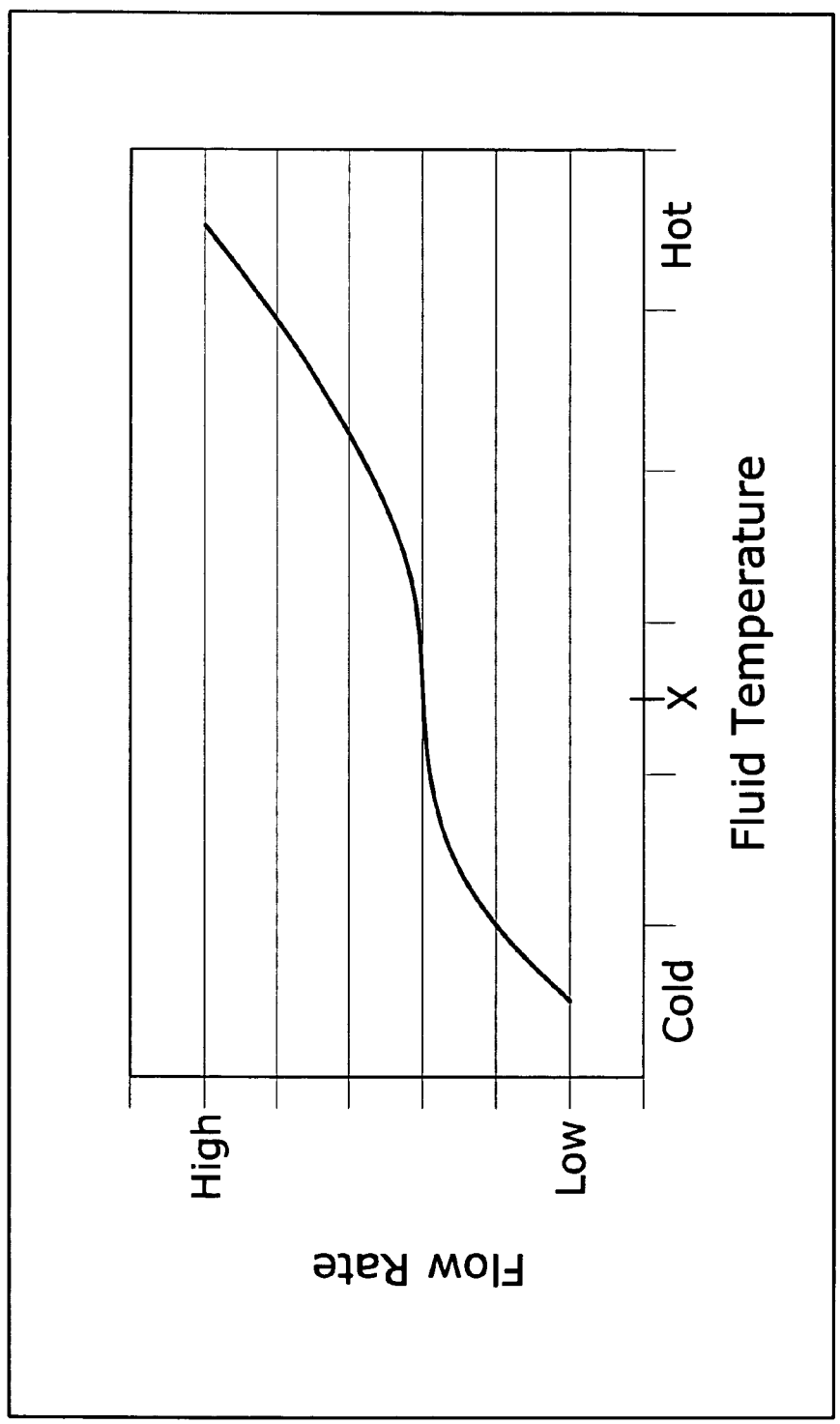
FIG. 5 is a chart illustrating the flow rate of the coolant based upon coolant temperature.

After the coolant temperature has increased to a level above the MOT 1, the first power supply 64 is activated by the second temperature switch 69 as shown in FIG. 3 of the drawings. The control unit 66 is also activated thereby entering into an initialize and self-test procedure. The pump unit 52 is also activated and operates at an initial flow rate A through both Path 1 and Path 2 as shown in FIGS. 3 and 4 of the drawings. FIG. 5 of the drawings illustrates a chart showing an exemplary flow rate of the pump unit 52 based upon the coolant temperature. If the temperature of the coolant is below Temperature X, the control valve 42 reduces the coolant flow through Path 2 of the coolant distribution system. If the temperature of the coolant is above Temperature X, the control valve 42 increases the coolant flow through Path 2 of the coolant distribution system to increase the cooling of the coolant by the external environment through the heat exchanger unit 40. The coolant heated by the heater unit 62 flows into the spray unit 30 thereby increasing the temperature of the electronic devices 12 and returns to the pump unit 52 through the attitude independent valves 50.

Figure 6:
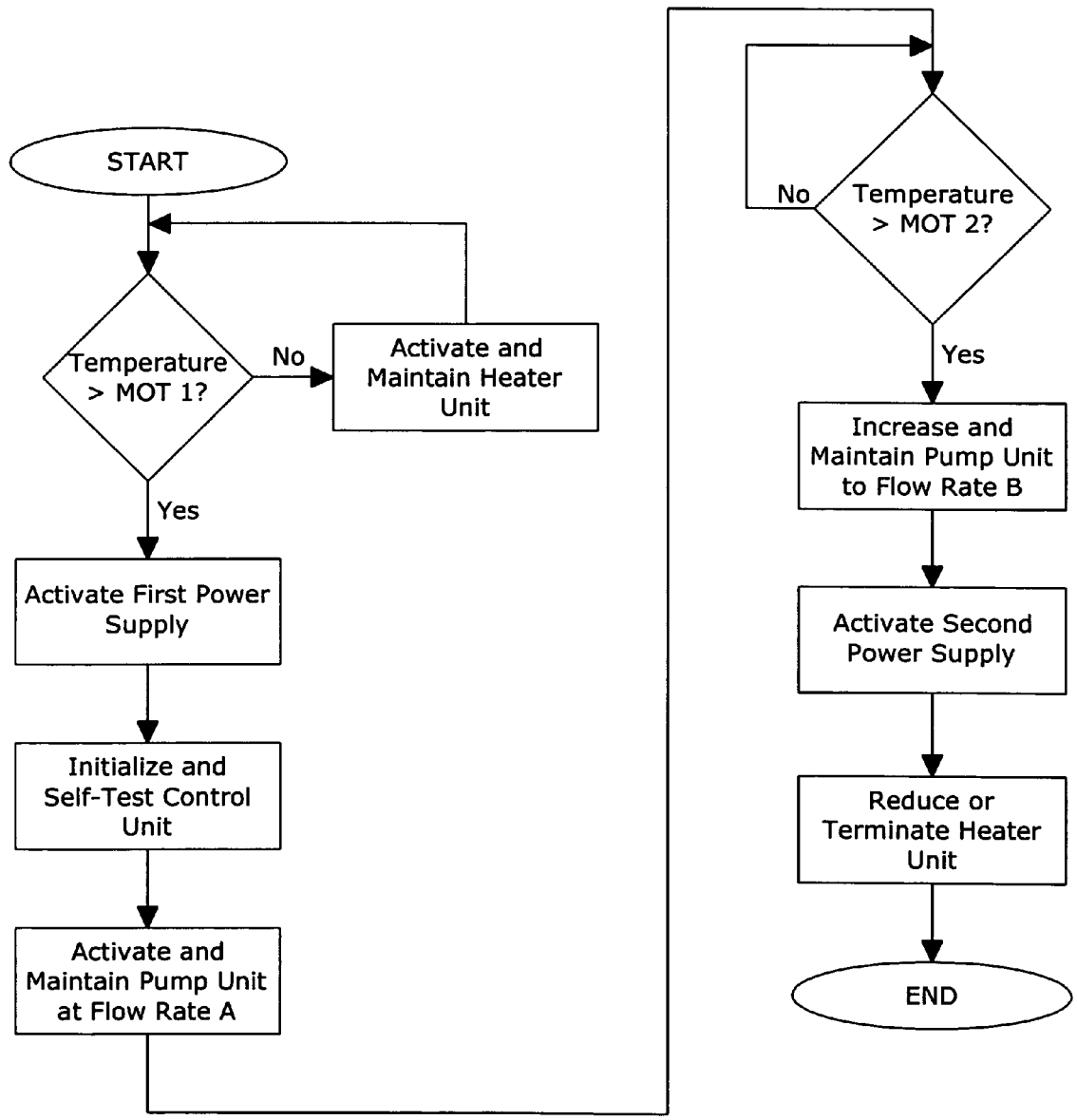
FIG. 6 is a flowchart illustrating an alternative embodiment of the activation and operation of the present invention.

When the temperature of the coolant increases above MOT 2, the coolant flow through the pump unit 52 is increased to flow rate B as shown in FIG. 3 of the drawings. In addition to increasing the flow rate of the pump unit 52, the second power supply 65 is thereafter activated thereby providing electrical power to the electronic devices 12 as further shown in FIG. 3 of the drawings. The coolant is thereafter heated by both the heater unit 62 and the electronic devices 12 during normal operation. If the temperature of the coolant is below Temperature X, the control valve 42 reduces the coolant flow through Path 2 of the coolant distribution system as shown in FIG. 4 of the drawings. If the temperature of the coolant is above Temperature X, the control valve 42 increases the coolant flow through Path 2 of the coolant distribution system to increase the cooling of the coolant by the external environment through the heat exchanger unit 40. If the coolant temperature exceeds the MOT 3, the heater unit 62 may either be terminated or reduced to decrease the heating of the coolant as shown in FIG. 3 of the drawings. Alternatively, the heater unit 62 may either be terminated or reduced to decrease the heating of the coolant immediately after the coolant temperature exceeds MOT 2 as shown in FIG. 6 of the drawings.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. An insulated enclosure for thermally managing at least one electronic device, comprising:
    an enclosure comprised of an outer wall and an inner wall positioned within said outer wall, wherein said inner wall defines an interior cavity, wherein said enclosure is positioned within an extreme external temperature environment;
    wherein said inner wall is flexible and resilient that allows for the expansion and contraction of said inner wall dependent upon the pressure within said interior cavity;
    a layer of insulation between said inner wall and said outer wall, wherein said layer of insulation completely surrounds said inner wall; and
    a thermal management unit within said interior cavity of said enclosure thermally managing at least one electronic device, wherein said thermal management unit is comprised of a spray unit that sprays a liquid coolant upon said at least one electronic device.

2. The insulated enclosure of claim 1, wherein said layer of insulation is attached to both said inner wall and said outer wall.

3. The insulated enclosure of claim 1, wherein said layer of insulation is comprised of fiber, plastic, acrylic, epoxy, an insulating gas, reinforced ceramics or a vacuum.

4. The insulated enclosure of claim 1, wherein said layer of insulation is comprised of a vacuum and a honeycomb reinforcing wall.

5. The insulated enclosure of claim 1, wherein said layer of insulation is comprised of a composite material.

6. The insulated enclosure of claim 5, wherein said layer of insulation is comprised of plastic and fiberglass.

7. The insulated enclosure of claim 5, wherein said layer of insulation is comprised of plastic and carbon fiber.

8. The insulated enclosure of claim 5, wherein said layer of insulation is comprised of plastic and graphite fiber.

9. The insulated enclosure of claim 1, wherein said layer of insulation has a thermal conductivity less than aluminum.

10. The insulated enclosure of claim 1, wherein said layer of insulation is comprised of an insulating fluid.

11. An insulated enclosure for thermally managing at least one electronic device, comprising:
    an enclosure defining an interior cavity, wherein said enclosure is positioned within an extreme external temperature environment;
    a layer of insulation attached to said enclosure, wherein said layer of insulation completely surrounds said interior cavity, wherein at least a portion of said layer of insulation is movable with respect to said enclosure to adjust the spacing between said layer of insulation and said enclosure; and
    a thermal management unit within said interior cavity of said enclosure thermally managing at least one electronic device, wherein said thermal management unit is comprised of a spray unit that sprays a liquid coolant upon said at least one electronic device.

12. The insulated enclosure of claim 11, wherein said layer of insulation is attached to substantially an entire inner surface of said enclosure.

13. The insulated enclosure of claim 11, wherein said layer of insulation is attached to a portion of an entire inner surface of said enclosure.

14. The insulated enclosure of claim 11, wherein said layer of insulation is comprised of fiber, plastic, acrylic or epoxy.

15. The insulated enclosure of claim 11, wherein said layer of insulation is comprised of a composite material.

16. The insulated enclosure of claim 15, wherein said layer of insulation is comprised of plastic and fiberglass.

17. The insulated enclosure of claim 15, wherein said layer of insulation is comprised of plastic and carbon fiber.

18. The insulated enclosure of claim 15, wherein said layer of insulation is comprised of plastic and graphite fiber.

19. The insulated enclosure of claim 11, wherein said layer of insulation has a thermal conductivity less than aluminum.

20. The insulated enclosure of claim 11, including at least one actuator connected to said layer of insulation to selectively move said insulation.

21. The insulated enclosure of claim 11, wherein at least a portion of said layer of insulation is slidable with respect to said enclosure.

22. The insulated enclosure of claim 11, wherein at least a portion of said layer of insulation is foldable with respect to said enclosure.

23. The insulated enclosure of claim 11, wherein said layer of insulation is comprised of a flexible material, and wherein said layer of insulation is retractable into and extendable from a storage unit.

24. An insulated enclosure for thermally managing at least one electronic device, comprising:

an enclosure comprised of an outer wall and an inner wall positioned within said outer wall, wherein said inner wall defines an interior cavity, wherein said enclosure is positioned within an extreme external temperature environment;

a thermal management unit within said interior cavity of said enclosure thermally managing at least one electronic device, wherein said thermal management unit is comprised of a spray unit that sprays a liquid coolant upon said at least one electronic device;

a first cavity between at least a portion of said inner wall and said outer wall; and a pump fluidly connected to said first cavity to automatically input or remove an insulating fluid with respect to said first cavity during use.

25. The insulated enclosure of claim 24, wherein said insulating fluid is comprised of an insulating gas.

26. The insulated enclosure of claim 25, wherein said insulating gas has a thermal conductivity less than aluminum.

27. The insulated enclosure of claim 24, wherein said insulating fluid is comprised of an insulating liquid.

28. The insulated enclosure of claim 25, wherein said insulating liquid has a thermal conductivity less than aluminum.

29. The insulated enclosure of claim 24, wherein said pump creates a vacuum within said first cavity.

* * * * *